(12) United States Patent
Goto et al.

(10) Patent No.: US 6,439,528 B1
(45) Date of Patent: Aug. 27, 2002

(54) STAND FOR SUPPORTING A CASING AND PREVENTING THE OVERTURNING THEREOF

(75) Inventors: Teiyu Goto; Takayuki Soga, both of Tokyo (JP)

(73) Assignee: Sony Computer Entertainment, Inc., Tokyo (JP)

( * ) Notice: Subject to any disclaimer, the term of this patent is extended or adjusted under 35 U.S.C. 154(b) by 0 days.

(21) Appl. No.: 09/645,118

(22) Filed: Aug. 24, 2000

(51) Int. Cl.[7] .............................................. A47G 29/00
(52) U.S. Cl. .................................... 248/346.01; 211/43
(58) Field of Search ............................ 248/346.01, 149, 248/146, 917, 920, 924, 918, 201, 172, 173, 674, 676, 678, 671; 211/42, 43; 108/51.1

(56) References Cited

U.S. PATENT DOCUMENTS

| | | | |
|---|---|---|---|
| 1,715,722 A | * 6/1929 | Smith et al. | |
| 1,963,242 A | * 6/1934 | Nelson | |
| 3,094,258 A | * 6/1963 | Punke | |
| 3,844,415 A | * 10/1974 | Heimann | 211/43 |
| 3,904,158 A | * 9/1975 | Michael | 248/149 |
| 4,118,002 A | * 10/1978 | Bartlett | 248/311.1 |
| 4,635,811 A | 1/1987 | Lodi | |
| 4,856,659 A | * 8/1989 | Krebs | 211/43 |
| 4,874,099 A | * 10/1989 | Arnott et al. | 211/43 |
| 5,020,768 A | * 6/1991 | Hardt et al. | 248/678 |
| 5,192,046 A | 3/1993 | Howard | |
| 5,263,668 A | 11/1993 | Reiter | |
| 5,295,648 A | 3/1994 | Hames | |
| 5,388,792 A | * 2/1995 | Hastings et al. | 248/188.1 |
| 5,397,081 A | * 3/1995 | Landry et al. | 248/346 |
| D362,245 S | * 9/1995 | Moffatt | 248/127 X |
| 5,839,713 A | * 11/1998 | Wright | 248/346.01 |
| 5,927,669 A | * 7/1999 | Sassman | 248/346.01 |
| 6,000,666 A | * 12/1999 | Kari | 248/346.01 |
| 6,059,384 A | * 5/2000 | Ho | 248/676 |
| 6,193,208 B1 | * 2/2001 | Schmitt et al. | 248/688 |

FOREIGN PATENT DOCUMENTS

| | | |
|---|---|---|
| JP | 5-266643 | 10/1993 |
| JP | 6-350276 | 12/1994 |

* cited by examiner

*Primary Examiner*—Daniel P. Stodola
*Assistant Examiner*—Jennifer E. Novosad
(74) *Attorney, Agent, or Firm*—Katten Muchin Zavis Rosenman

(57) ABSTRACT

The stand comprises a pair of stand members. Each of the stand members is integrally formed with a casing support section and a connecting section. Projections are provided on the connecting section. The projections are used to connect the stand members to one another, and they are used to attach the stand members to the casing.

7 Claims, 12 Drawing Sheets

STAND FOR SUPPORTING A CASING AND PREVENTING THE OVERTURNING THEREOF

BACKGROUND OF THE INVENTION

1. Field of the Invention

The present invention relates to a stand for a casing, for supporting the casing in order to prevent the casing from overturning.

2. Description of the Related Art

Recently, a variety of apparatuses including, for example, personal computers, external storage units for the same, and AV apparatuses are constructed in some cases such that the installation attitude can be selected from the horizontal placement and the vertical placement.

A stand for avoiding the overturning is utilized for such an apparatus when the vertical placement is selected.

For example, in some cases, such a stand comprises a pair of members each having a nipping tab for nipping and supporting both side surfaces of the apparatus and a placing surface for placing the apparatus thereon, wherein the members are joined to one another by the aid of screws (first illustrative conventional technique, see, for example, Japanese Laid-Open Patent Publication No. 5-266643).

For example, in other cases, such a stand comprises a pair of members each having a nipping section for nipping and supporting both side surfaces of the apparatus, a projection for placing the apparatus thereon, and legs, wherein these members are rotatably connected to one another (second illustrative conventional technique, see, for example, Japanese Laid-Open Patent Publication No. 6-350276).

For example, in other cases, a pair of bookstands (bookshelves) are substitutively used as a stand for the apparatus (third illustrative conventional technique). The bookstand is constructed, for example, by plate-shaped sections which are joined to one another at the right angle.

However, in the case of the stand concerning the first conventional technique described above, the respective members are joined to one another by using the screws. Further, it is necessary to adjust the spacing distance between the nipping tabs on the basis of the widthwise dimension of the apparatus. For this reason, it is feared that the assembling operation for the stand may be complicated.

In the case of the stand concerning the second conventional technique described above, the respective members are rotatably connected to one another. For this reason, the stand involves such a drawback that the structure is complicated.

Further, in the case of the bookstands concerning the third conventional technique described above, the respective bookstands are not joined to one another. Therefore, it is impossible to stably support the apparatus. Further, when the plate-shaped sections, which function as legs, are overlapped with each other, any looseness arises at concerning portions. As a result, it is feared that it may be more difficult to stably support the apparatus.

SUMMARY OF THE INVENTION

The present invention has been made in order to dissolve the inconveniences as described above, an object of which is to provide a stand for a casing, in which the structure is simple, the assembling operation is easy, and it is possible to stably support the casing.

According to the present invention, there is provided a stand for a casing, comprising a pair of stand members; each of the stand members including a casing support section having a support surface section for supporting a side surface portion of the casing; and a connecting section for connecting the stand members to one another; wherein the connecting section is joined to the casing support section at a position which is deviated as viewed in a plan view along the support surface section with respect to a central position of the casing support section in each of the stand members.

Owing to the arrangement as described above, it is possible to obtain the stand for the casing, having a simple structure. Further, for example, no looseness arises when the stand members are placed on a base.

The stand for the casing according to the present invention includes an attachment section for attaching the stand member to the casing.

According to another aspect of the present invention, there is provided a stand for a casing, comprising a pair of stand members; each of the stand members including a casing support section having a support surface section for supporting a side surface portion of the casing; a connecting section for connecting the stand members to one another; and an attachment section for attaching the stand member to the casing.

In this arrangement, it is also preferable that the attachment section is a projection which is capable of being fitted to a hole formed in the casing. Accordingly, it is easy to perform the operation for attaching the stand members to the casing.

It is also preferable that the projection is provided on the connecting section.

The respective stand members are connected to one another at a forward end of the connecting section on one side and the casing support section on the other side and at a forward end of the connecting section on the other side and the casing support section on one side.

Specifically, a hole is formed in the casing support section; and a projection, which is capable of being fitted to the hole of the casing support section, is provided at a forward end of the connecting section. Accordingly, it is easy to perform the operation for attaching the stand members to the casing.

It is also preferable that the stand members support the casing having a substantially rectangular parallelepiped-shaped configuration which is vertically placed.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

An embodiment of the present invention will be explained below with reference to the drawings.

Figure 1:
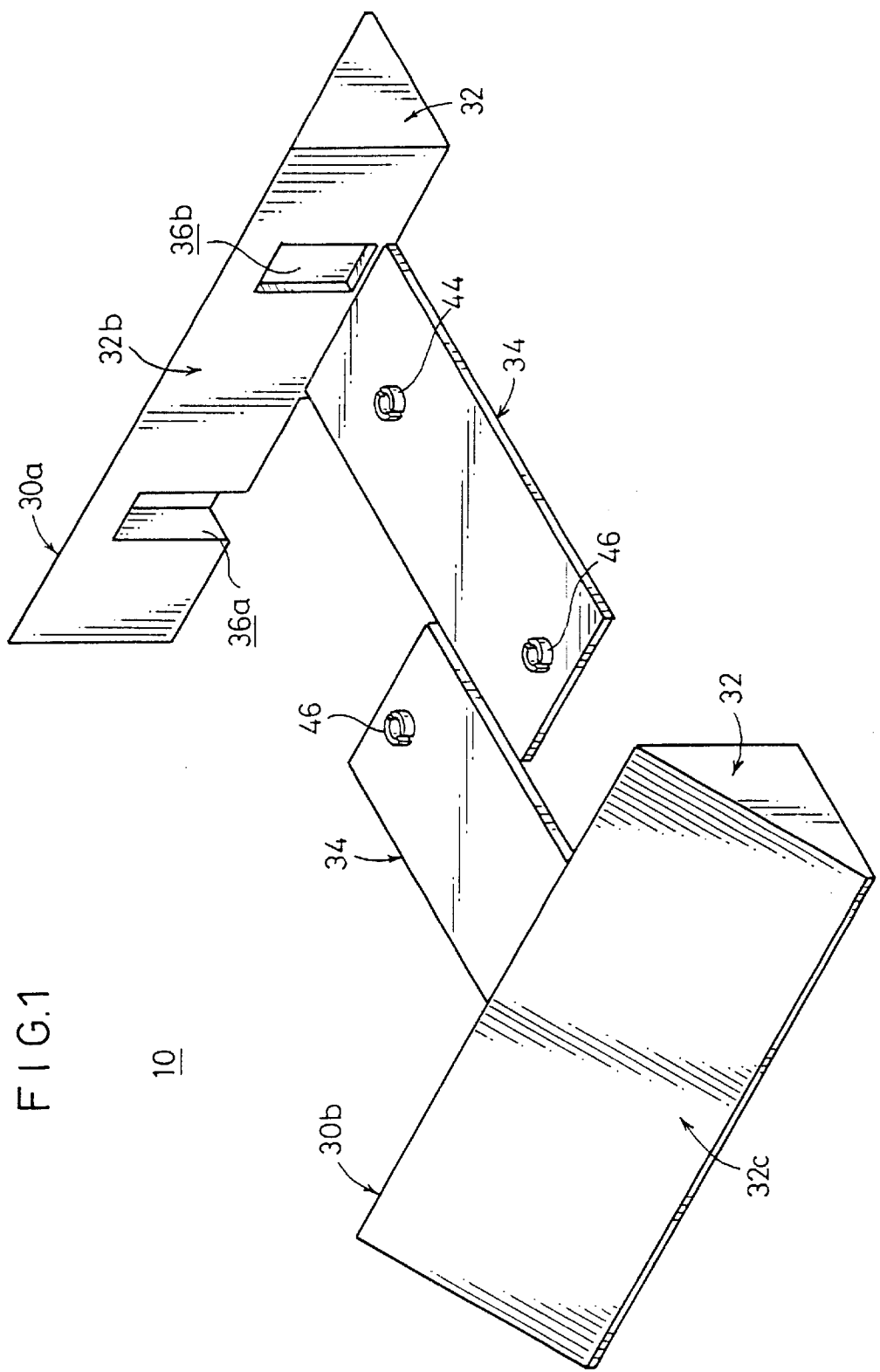
FIG. 1 shows a perspective view illustrating an arrangement of a stand to which an embodiment of the present invention is applied.
Figure 2:
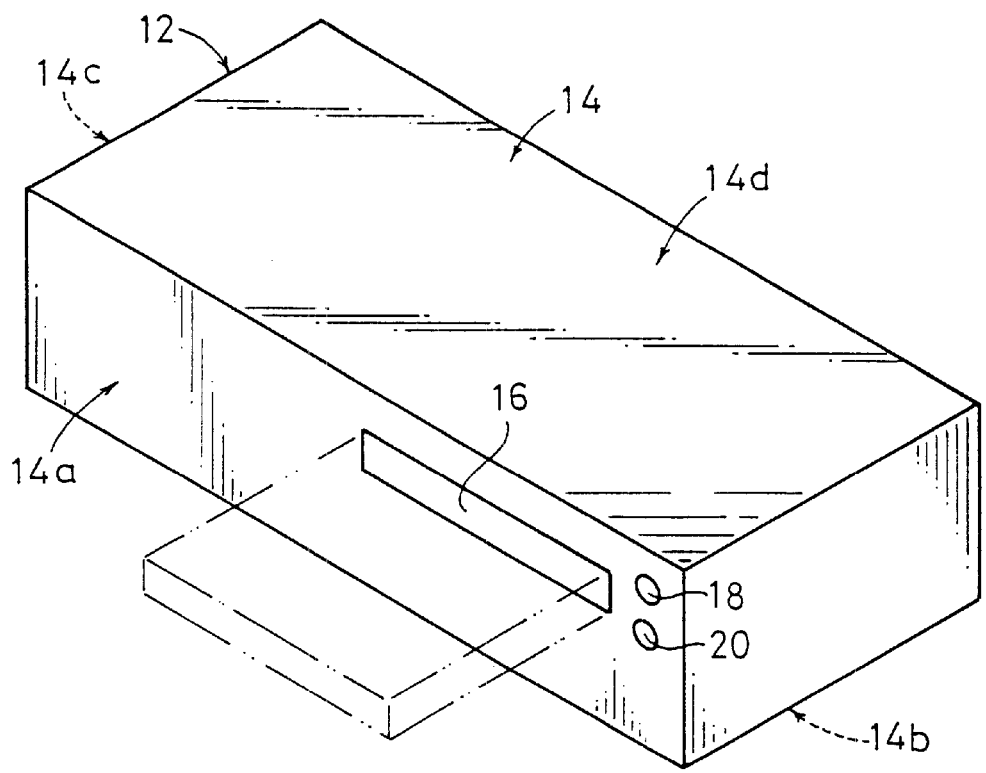
FIG. 2 shows a perspective view illustrating a disk drive apparatus.

FIG. 1 shows an arrangement of a stand 10 to which an embodiment of the present invention is applied. FIG. 2 shows an arrangement of a disk drive apparatus 12 to which the stand 10 is installed. FIG. 2 shows a state in which the disk drive apparatus 12 is horizontally placed {state in which the disk drive apparatus 12 is placed on a base with a surface having the widest areal size (bottom surface section 14b as described later on) being disposed downwardly}.

At first, the disk drive apparatus 12 shown in FIG. 2 will be explained. The disk drive apparatus 12 is a recording/reproducing apparatus for a recording medium such as CD, CD-ROM, CD-R, and DVD. The disk drive apparatus 12 is provided with a casing 14 having a substantially rectangular parallelepiped-shaped configuration. A disk tray 16 based on the front loading system is provided at an upper-right portion of a front surface section 14a of the casing 14. A power switch 18 and an eject switch 20 for the disk tray 16 are provided on the right side of the disk tray 16.

Figure 3:
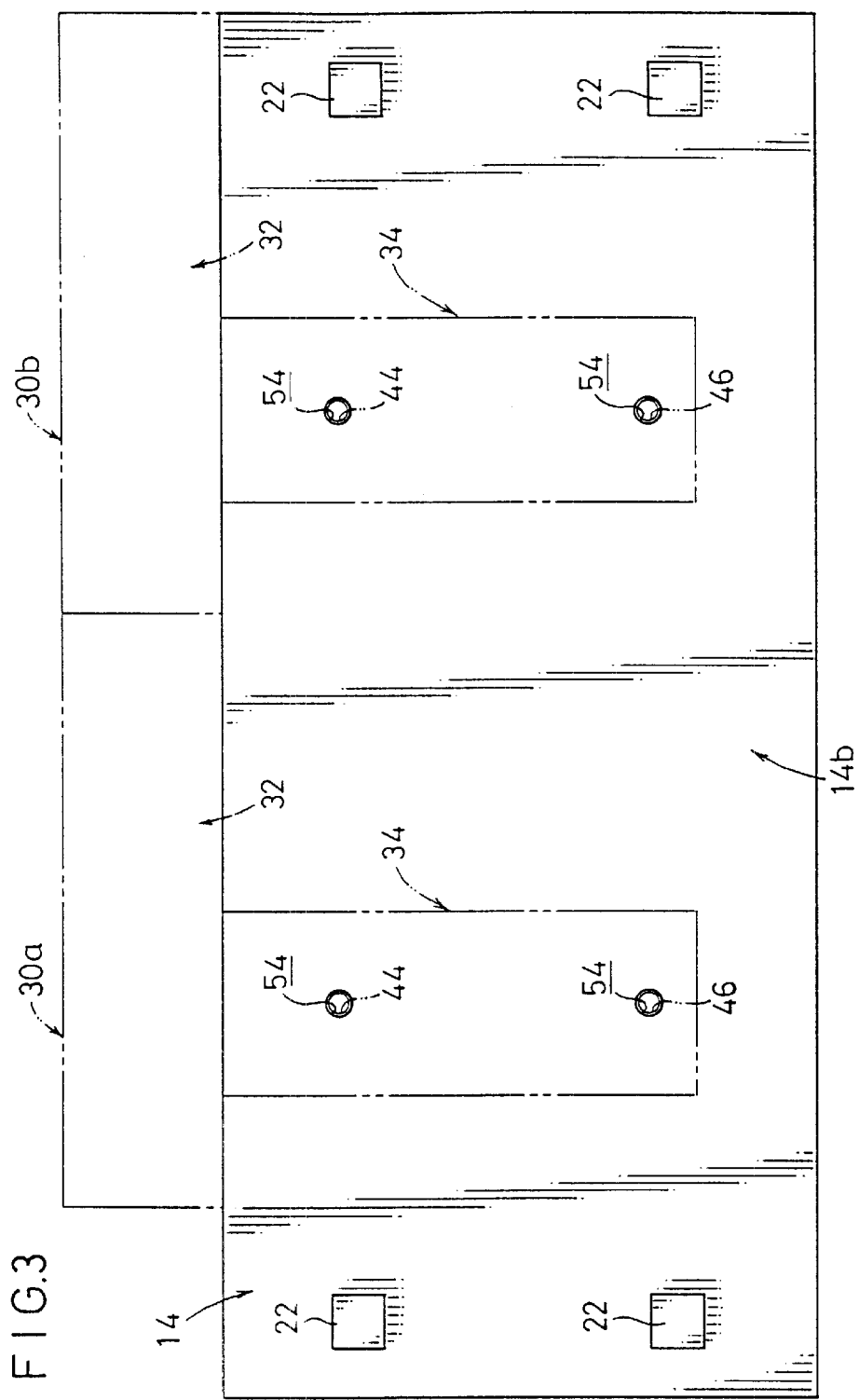
FIG. 3 shows a bottom view illustrating the disk drive apparatus.
Figure 4:
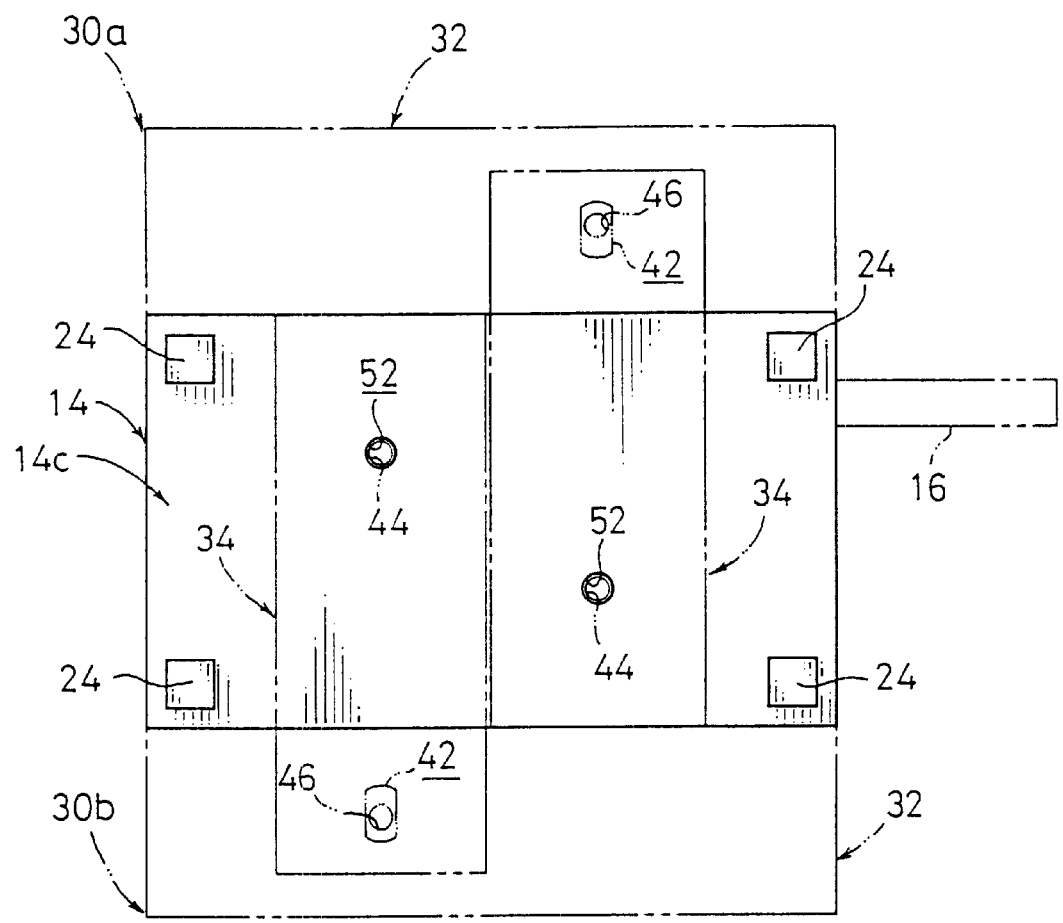
FIG. 4 shows a left side view illustrating the disk drive apparatus.

FIG. 3 shows a bottom view illustrating the disk drive apparatus 12, and FIG. 4 shows a left side view illustrating the disk drive apparatus 12.

As shown in FIG. 3, legs 22, which are used for the horizontal placement, are attached to portions in the vicinity of four corners of the bottom surface section 14b of the casing 14. The legs 22 are made of, for example, a resin material such as plastic and rubber.

As shown in FIG. 4, legs 24, which are used for the vertical placement, are attached to portions in the vicinity of four corners of the left side surface section 14c of the casing 14. The legs 24 are made of, for example, a resin material such as plastic and rubber, in the same manner as the legs 22 of the bottom surface section 14b.

Next, the stand 10 shown in FIG. 1 will be explained. The stand 10 comprises a pair of stand members 30a, 30b. The stand members 30a, 30b are formed to have a substantially identical shape. For example, synthetic resin such as ABS (acrylonitrile-butadiene-styrene resin) is adopted as a material for the stand members 30a, 30b.

Each of the stand members 30a, 30b is formed in an integrated manner, comprising a casing support section 32 having a substantially triangular prism-shaped configuration, and a flat plate-shaped connecting section 34.

Figure 5:
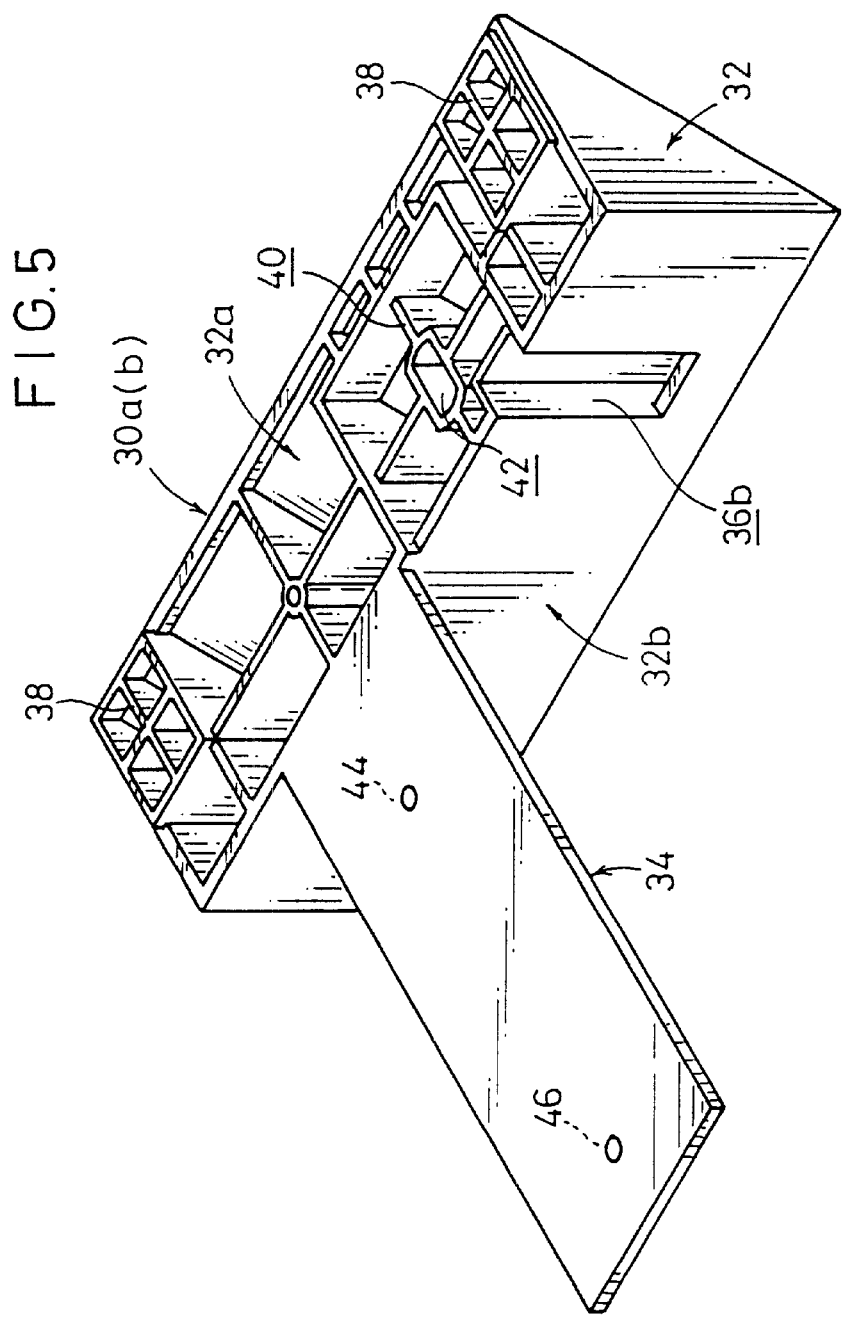
FIG. 5 shows a perspective view illustrating lower portions of a stand member for constructing the stand.

FIG. 5 shows a perspective view illustrating lower portions of the stand member 30a, 30b. As shown in FIGS. 1 and 5, the casing support section 32 is formed to have a right triangle-shaped cross section, and it includes a bottom surface section 32a, a support surface section 32b which is connected to the bottom surface section 32a at the right angle, and an appearance surface section 32c which is interposed between the bottom surface section 32a and the support surface section 32b.

As shown in FIG. 1, the support surface section 32b is the portion which supports the bottom surface section 14b or the upper surface section 14d of the casing 14 when the disk drive apparatus 12 is vertically placed as described later on (see FIG. 8). The support surface section 32b has cutouts 36a, 36b which are formed to avoid any contact with the legs 22 (see FIG. 3) of the bottom surface section 14b.

As shown in FIG. 5, convex sections 38, which are formed to be convex with respect to a reference surface (surface on the same plane as the bottom surface of the connecting section 34), are provided at corners on the side of the appearance surface section 32c, of the bottom surface section 32a of the casing support section 32. A cushion member or the like may be stuck to the convex section 38.

A concave section 40, which has a planar configuration corresponding to the forward end of the connecting section 34 and which is formed to be concave with respect to the reference surface, is provided at a right side portion of the bottom surface section 32a as shown in FIG. 5 (portion deviated rightwardly in FIG. 5 with respect to the central position of the casing support section 32). A long hole 42 is formed at a substantially central portion of the concave section 40.

The connecting section 34 is formed to have a flat plate-shaped configuration of a substantially rectangular shape as viewed in a plan view. The connecting section 34 is joined to the casing support section 32 at the support surface section 32b so that the bottom surface of the connecting section 34 is located on the same plane as the bottom surface section 32a of the casing support section 32. The connecting section 34 is joined to a left side portion of the support surface section 32b as shown in FIG. 5 (portion deviated leftwardly in FIG. 5 with respect to the central position of the casing support section 32). In other words, the connecting section 34 is joined to the casing support section 32 at the position which is deviated in plane (as viewed in a plan view) along the support surface section 32b with respect to the central position of the casing support section 32.

As shown in FIG. 1, two projections 44, 46, which are constructed by two projection tabs each having a substantially ring-shaped cross section, are provided on the upper surface section of the connecting section 34. The projection 46 of the projections 44, 46, which is provided on the forward end side of the connecting section 34, is formed to have a shape which is capable of being fitted to the long hole 42 (see FIG. 5) formed in the bottom surface section 32a of the casing support section 32. The projection 46 is detachable with respect to the long hole 42.

Figure 6:
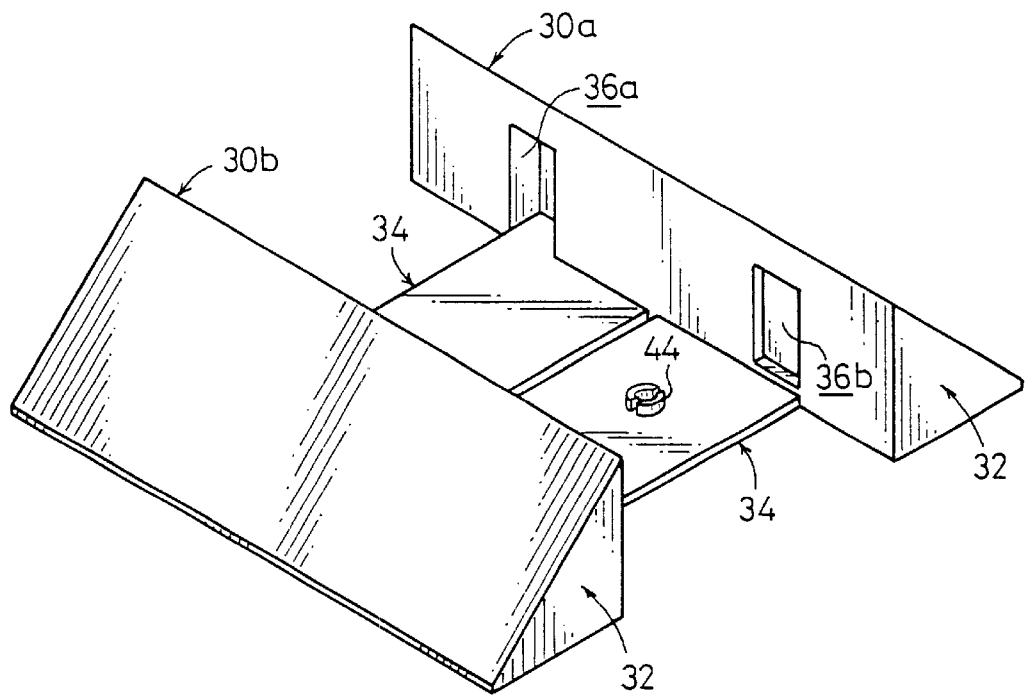
FIG. 6 shows a perspective view illustrating a state in which the stand members are assembled to one another.
Figure 7:
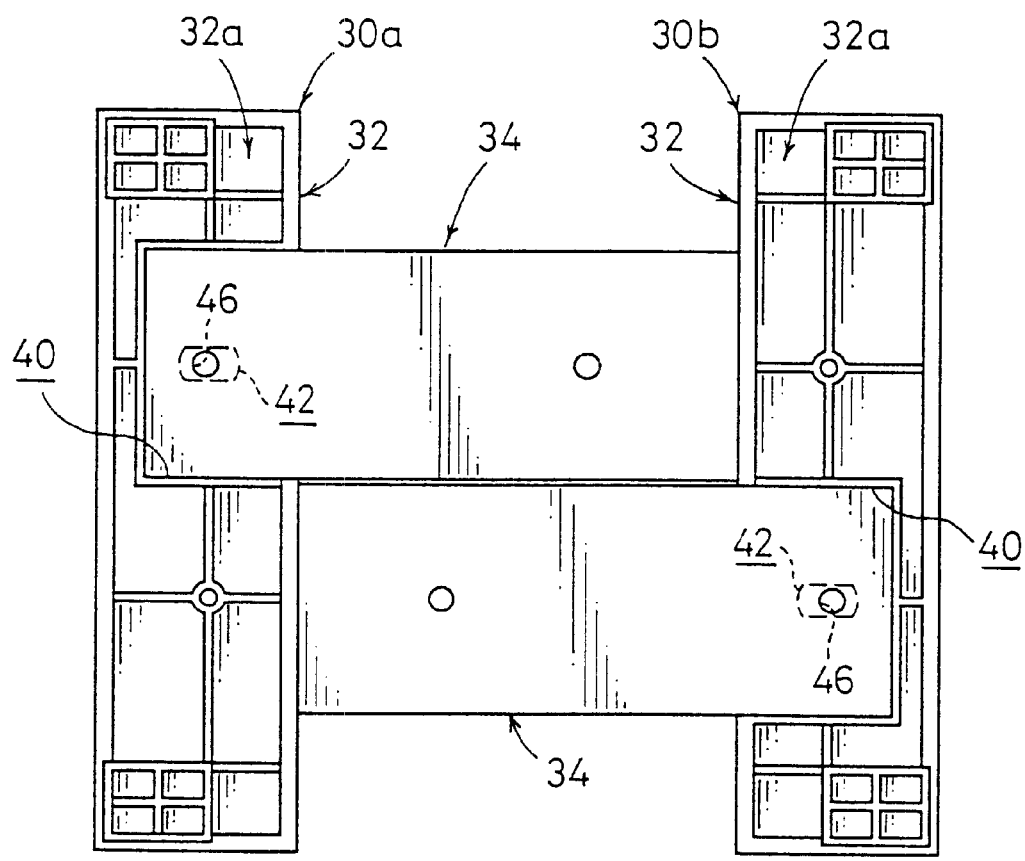
FIG. 7 shows a bottom view illustrating the state in which the stand members are assembled to one another.

FIGS. 6 and 7 show a state in which the stand members 30a, 30b are assembled to one another to construct the stand 10. In this arrangement, the stand members 30a, 30b are connected to one another such that the forward end of the connecting section 34 of one of them is installed to the concave section 40 of the other of them respectively, and the projection 46 is fitted to the long hole 42.

In this case, as described above, the connecting sections 34 are joined to the casing support sections 32 respectively at the positions deviated as viewed in a plan view with respect to the central positions of the casing support sections 32. Accordingly, the connecting sections 34 do not interfere with each other. Therefore, no looseness or the like arises when the stand 10 is placed on the base.

The projection 46 is detachable with respect to the long hole 42. Therefore, it is easy to perform the operation for assembling the stand members 30a, 30b to one another.

Figure 8:
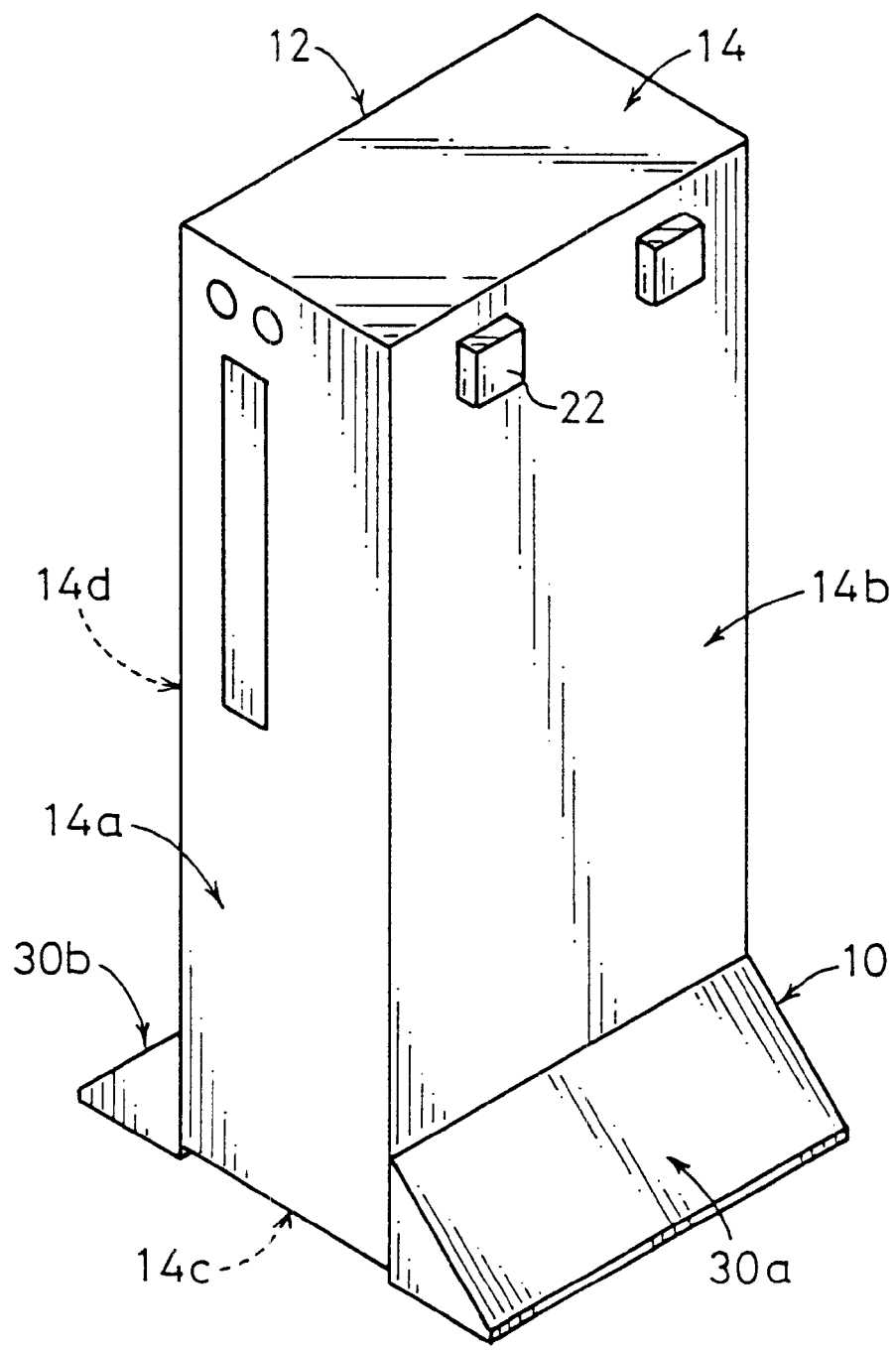
FIG. 8 shows a perspective view illustrating a state in which the stand is installed to the disk drive apparatus which is vertically placed.

FIG. 8 shows a state in which the stand 10 is installed to the disk drive apparatus 12 which is vertically placed (disk drive apparatus 12 is placed with the left side surface section 14c disposed downwardly on the unillustrated base or the like). In FIG. 8, the left side surface section 14c of the casing 14 serves as a lower surface section, and the bottom surface section 14b and the upper surface section 14d serve as both side surface sections.

The stand 10 is attached to the casing 14 by fitting the projections 44 (see FIG. 1) as attachment sections to bottom-equipped or bottomless (bottom opening) holes 52 (see FIG. 4) formed at the left side surface section 14c of the casing 14. In this arrangement, the projection 44 is detachable with respect to the hole 52. Therefore, it is easy to perform the operation for installing the stand 10 to the casing 14.

Alternatively, face fasteners (magic tapes: registered trademark) may be installed to the left side surface section 14c of the casing 14 and to the connecting sections 34 of the stand members 30a, 30b respectively. The stand members 30a, 30b may be attached to the casing 14 by sticking the face fasteners to one another.

Further alternatively, the projection 44 (or the face fastener) may be provided at the support surface section 32b of the casing support section 32. In this case, the hole 52 (or the other face fastener) is provided at the bottom surface section 14b and the upper surface section 14d of the casing 14.

The respective stand members 30a, 30b are attached to the casing 14 as described above. Further, the stand members 30a, 30b are connected to one another by fitting the projections 46 to the long holes 42. Therefore, it is unnecessary to perform the operation for adjusting the spacing distance between the support surface sections 32b when the stand members 30a, 30b are installed to the casing 14.

Figure 9:
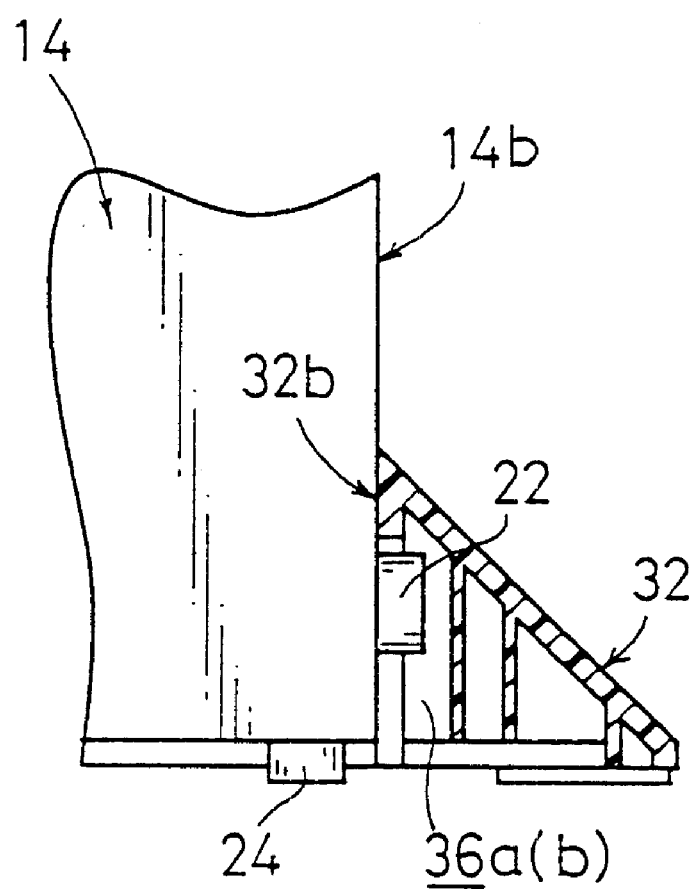
FIG. 9 shows a sectional view illustrating a state in which a leg, which is provided on a bottom surface section of the disk drive apparatus, is accommodated in a cutout formed on the stand.

As shown in FIGS. 6 and 8, the stand 10 supports the casing 14 by nipping the casing 14 with the support surface sections 32b on the side of the bottom surface section 14b and on the side of the upper surface section 14d. In this arrangement, as shown in FIG. 9, the legs 22, which are provided on the bottom surface section 14b of the casing 14, are accommodated in the cutouts 36a, 36b. Therefore, the contact between the leg 22 and the support surface section 32b is avoided. The cutout 36a, 36b may be formed to have a shape in which the accommodated leg 22 can be held (for example, a shape to which the leg 22 can be fitted).

Figure 10:
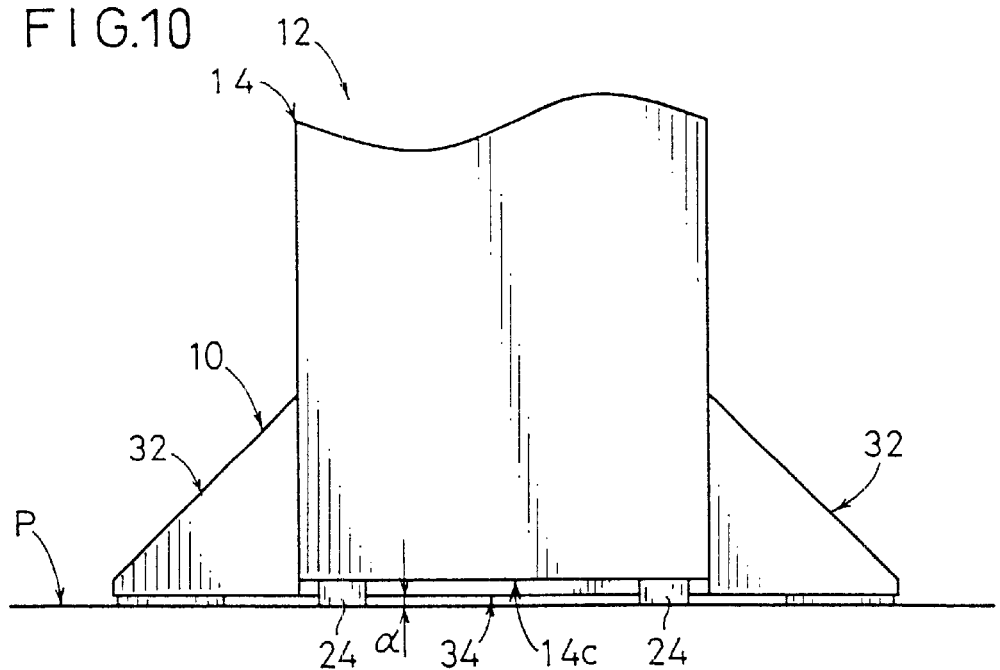
FIG. 10 shows a front view illustrating, in a magnified manner, lower portions of the disk drive apparatus to which the stand is installed.

FIG. 10 shows, in a magnified manner, lower portions (on the side of the left side surface section 14c) of the disk drive apparatus 12 to which the stand 10 shown in FIG. 8 is installed. As shown in FIG. 10, a gap α is formed between the lower surface of the connecting section 34 and the base P on which the disk drive apparatus 12 is placed.

That is, the self-weight of the disk drive apparatus 12 which is vertically placed is supported by the legs 24. In this arrangement, the stand 10 functions as a support means for preventing the disk drive apparatus 12 from overturning.

Figure 11:
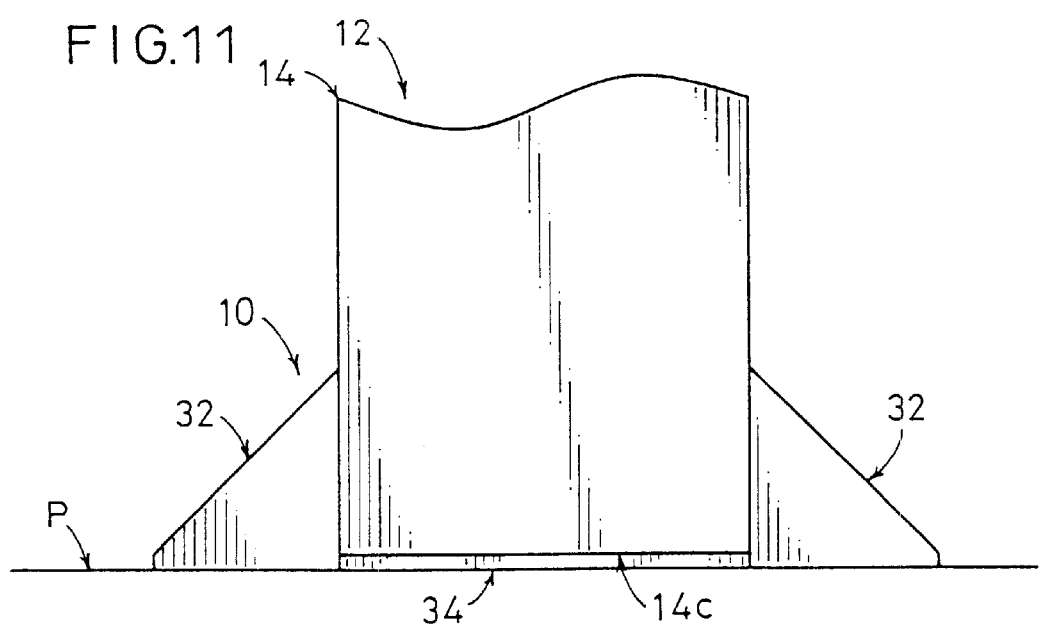
FIG. 11 shows a front view illustrating a state in which the stand is installed to a disk drive apparatus which has no leg.

As shown in FIG. 11, for example, when the casing 14 of the disk drive apparatus 12 is not provided with the leg 24, the stand 10 supports the self-weight of the disk drive apparatus 12 at the connecting sections 34. Even when the casing 14 is provided with the legs 24, the self-weight of the disk drive apparatus 12 may be supported by the connecting sections 34.

Figure 12:
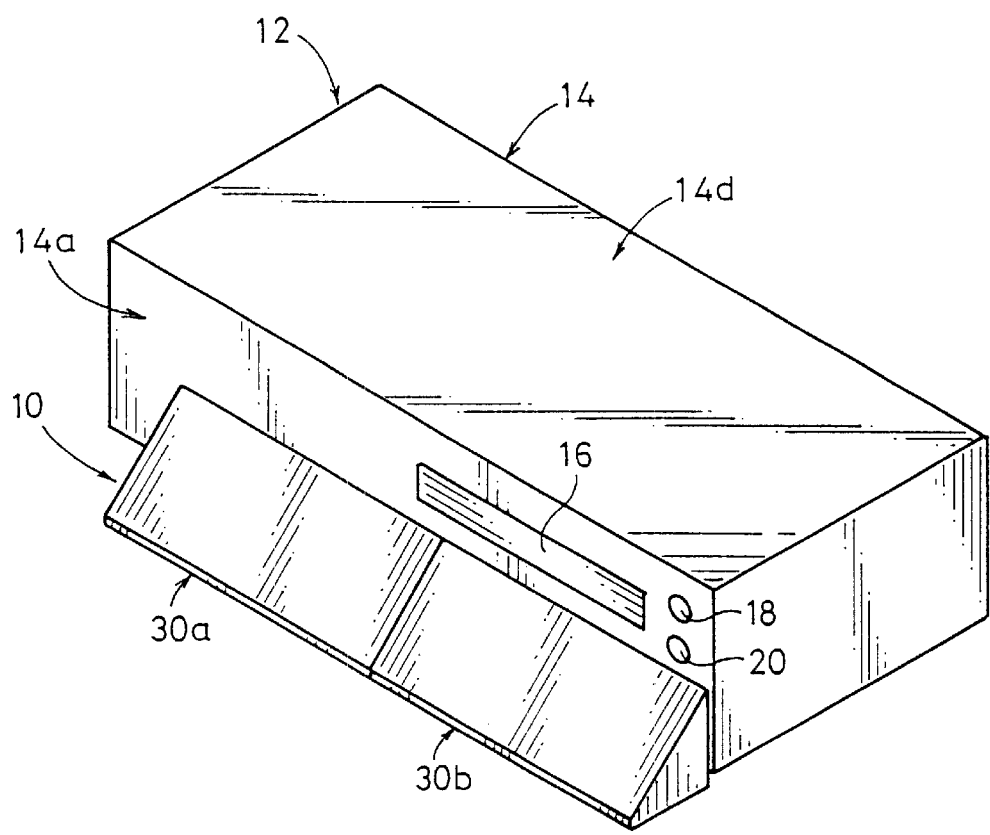
FIG. 12 shows a perspective view illustrating a state in which the stand is installed to the disk drive apparatus which is horizontally placed.
Figure 13:
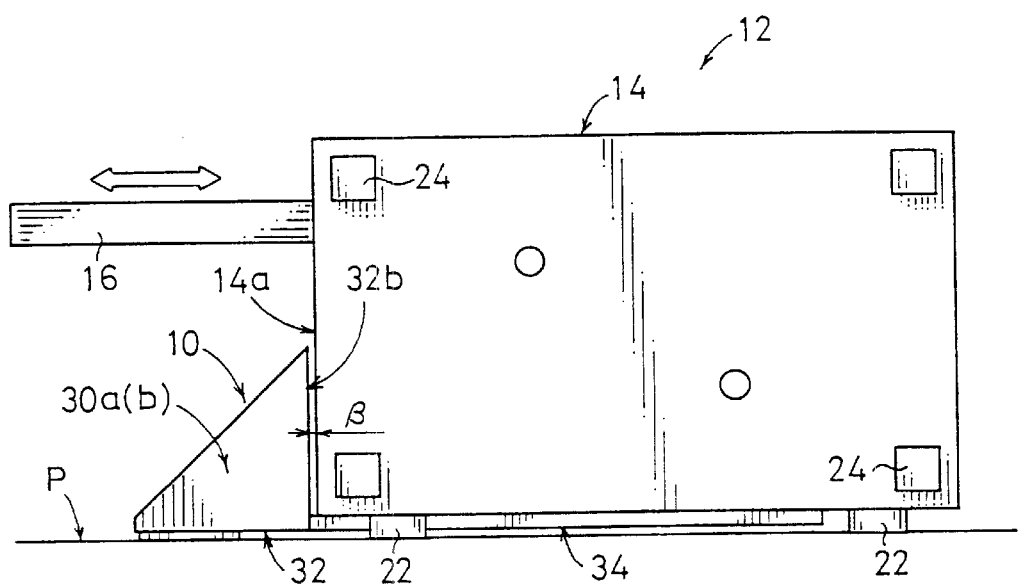
FIG. 13 shows a side view illustrating the state in which the stand is installed to the disk drive apparatus which is horizontally placed.

Next, FIGS. 12 and 13 show a state in which the stand 10 is installed to the disk drive apparatus 12 which is horizontally placed. In this arrangement, the stand members 30a, 30b, which construct the stand 10, are installed to the casing 14 in a state of lateral juxtaposition so that the support surface sections 32b are opposed to the front surface section 14a of the casing 14.

In this arrangement, as shown in FIG. 3, the stand members 30a, 30b are attached to the casing 14 by fitting the projections 44, 46 formed on the connecting sections 34 to the bottom-equipped or bottomless (bottom opening) holes 54 formed in the bottom surface section 14b of the casing 14 respectively. Accordingly, it is easy to perform the operation for installing the stand members 30a, 30b to the casing 14.

As shown in FIG. 13, when the stand 10 is installed to the disk drive apparatus 12 which is horizontally placed, the casing 14 is prevented from overturning even if the disk tray 16 is ejected from the casing 14, and the center of gravity of the disk drive apparatus 12 is deviated toward the front surface section 14a.

A gap β is formed between the front surface section 14a of the casing 14 and the support surface sections 32b of the stand members 30a, 30b. Accordingly, even when an air supply port or an air discharge port (not shown) for releasing the heat is provided at the front surface section 14a of the casing 14, the air supply port or the air discharge port is not closed by the support surface section 32b. Therefore, it is possible to reliably ensure the ventilation at the air supply port or the air discharge port.

As described above, the stand 10 according to this embodiment is constructed by the pair of stand members 30a, 30b which have substantially the same shape. Therefore, the stand 10 can be produced inexpensively. Specifically, the stand members 30a, 30b can be produced by using an identical molding mold. Accordingly, it is possible to reduce the production cost.

The connecting sections 34 are joined to the casing support sections 32 at the positions deviated as viewed in a plan view with respect to the central positions of the casing support sections 32 respectively. Accordingly, no looseness or the like occurs when the stand 10 is placed on the base. Therefore, it is possible to stably support the casing 14.

The projections 46, which are provided on the connecting sections 34, are detachable with respect to the long holes 42 which are provided in the casing support sections 32. Therefore, it is easy to perform the operation for assembling the stand members 30a, 30b to one another.

The projections 44, which are provided on the connecting sections 34, are detachable with respect to the holes 52, 54 formed in the casing 14. Therefore, it is easy to perform the operation for installing the stand 10 to the casing 14.

The stand 10 can be also installed to the disk drive apparatus 12 which is horizontally placed. Therefore, when the disk drive apparatus 12 is used in the horizontal placement, it is unnecessary to newly ensure the place for accommodating the stand 10.

The stand 10 according to this embodiment is constructed as the support means for supporting the disk drive apparatus 12. However, in addition to the disk drive apparatus 12, the stand 10 is also applicable to various apparatuses including, for example, recording/reproducing apparatuses such as flexible disks and hard disks, personal computers, and AV apparatuses.

According to the present invention, it is possible to obtain the stand for the casing, in which the structure is simple, the assembling operation is easy, and it is possible to stably support the casing.

What is claimed is:

1. A stand for a casing, comprising:
a pair of stand members, each of said stand members further comprising:
   a casing support section having a support surface section for supporting a side surface portion of said casing;
   a connecting section for connecting said stand members to one another; and
   at least one cutout disposed in said support surface section of said casing support section for accommodating a lateral projection extending from said casing,
   wherein said connecting section is joined to said casing support section, said connecting section extending outwardly from said casing support section along a plane defined by a bottom surface of said casing support section;
   wherein a forward end of the connecting section of one of said pair of stand members is connected to said casing support section of another one of said pair of stand members, and vice versa;
   wherein a hole is formed in the casing support section of each of said stand members; and
   wherein a projection is provided at said forward end of the connecting section of each of said pair of stand members, the projection of one of said pair of stand members being capable of being fitted in the hole of the casing support section in another of said pair of stand members, and vice versa.

2. The stand for said casing according to claim 1, wherein each of said stand members has an attachment section for attaching said stand member to said casing.

3. The stand for said casing according to claim 2, wherein said attachment section is a projection which is capable of being fitted in a hole formed in said casing.

4. The stand for said casing according to claim 1, wherein said stand members are adapted to support a casing having a substantially rectangular parallelepiped-shaped configuration which is oriented vertically.

5. A stand for a casing, comprising:
a pair of stand members, each of said stand members further comprising:
   a casing support section having a support surface section for supporting a side surface portion of said casing;
   a connecting section for connecting said stand members to one another;
   an attachment section for attaching said stand member to said casing; and
   at least one cutout disposed in said support surface section of said casing support section for accommodating a lateral projection extending from said casing;
   wherein a forward end of the connecting section of one of said pair of stand members is connected to said casing support section of another one of said pair of stand members, and vice versa;
   wherein a hole is formed in the casing support section of each of said stand members; and
   wherein a projection is provided at the forward end of the connecting section of each of said pair of stand members, the projection of one of said pair of stand members being capable of being fitted in the hole of the casing support section in another of said pair of stand members, and vice versa.

6. The stand for said casing according to claim 5, wherein said attachment section is a projection which is capable of being fitted in a hole formed in said casing.

7. The stand for said casing according to claim 5, wherein said stand members are adapted to support a casing having a substantially rectangular parallelepiped-shaped configuration which is oriented vertically.

* * * * *

UNITED STATES PATENT AND TRADEMARK OFFICE
CERTIFICATE OF CORRECTION

PATENT NO.   : 6,439,528 B1
DATED        : August 27, 2002
INVENTOR(S)  : Teiyu Goto et al.

It is certified that error appears in the above-identified patent and that said Letters Patent is hereby corrected as shown below:

<u>Title page,</u>
Item [30], please add as follows:
-- [30] Foreign Application Priority Data
   (JP) 11-239947 …… Aug. 26, 1999 --

Signed and Sealed this

Fifth Day of November, 2002

Attest:

Attesting Officer

JAMES E. ROGAN
Director of the United States Patent and Trademark Office